US009581384B1

(12) United States Patent
Scofield et al.

(10) Patent No.: US 9,581,384 B1
(45) Date of Patent: Feb. 28, 2017

(54) PORTABLE TEMPERATURE REGULATION DEVICES USING HEAT TRANSFER DEVICES

(71) Applicant: Magni-Power Company, Wooster, OH (US)

(72) Inventors: William H. Scofield, North Aurora, IL (US); Bala Venkataraman, Wooster, OH (US)

(73) Assignee: Magni-Power Company, Wooster, OH (US)

( * ) Notice: Subject to any disclaimer, the term of this patent is extended or adjusted under 35 U.S.C. 154(b) by 0 days.

(21) Appl. No.: 15/248,640

(22) Filed: Aug. 26, 2016

Related U.S. Application Data

(60) Provisional application No. 62/280,404, filed on Jan. 19, 2016.

(51) Int. Cl.

| | |
|---|---|
| ***F25B 21/04*** | (2006.01) |
| ***H01L 35/00*** | (2006.01) |
| ***F25D 31/00*** | (2006.01) |
| ***F25B 21/02*** | (2006.01) |
| ***A61J 1/16*** | (2006.01) |

(52) U.S. Cl.
CPC .............. *F25D 31/007* (2013.01); *A61J 1/16* (2013.01); *A61J 1/165* (2013.01); *F25B 21/02* (2013.01); *F25B 2321/0212* (2013.01); *F25D 2201/14* (2013.01); *F25D 2331/803* (2013.01); *F25D 2331/805* (2013.01); *F25D 2331/808* (2013.01); *F25D 2700/14* (2013.01)

(58) Field of Classification Search
CPC ......... F25D 2331/803; F25D 2331/809; F25D 31/007; F25D 2331/805; F25D 31/008; F25D 2700/14; F25D 2201/14; F25B 21/02; F25B 21/04; F25B 2321/0212; H01L 35/00; A47G 2023/0275; A61J 1/16; A61J 1/165; B60N 3/104
See application file for complete search history.

(56) References Cited

U.S. PATENT DOCUMENTS

| | | | | | |
|---|---|---|---|---|---|
| 1,638,402 | A * | 8/1927 | Locker et al. | F25D 31/007 | 62/125 |
| 2,959,925 | A * | 11/1960 | Frantti | A47J 36/2433 | 136/204 |
| 2,991,628 | A * | 7/1961 | Tuck | F25B 21/04 | 136/204 |
| 3,287,923 | A * | 11/1966 | Elfving | F24F 5/0042 | 136/203 |
| 5,228,923 | A * | 7/1993 | Hed | H01L 35/32 | 136/203 |
| 5,331,817 | A * | 7/1994 | Anthony | A47J 36/28 | 62/293 |
| 5,634,343 | A * | 6/1997 | Baker, III | B67D 3/0009 | 222/146.6 |

(Continued)

*Primary Examiner* — Frantz Jules
*Assistant Examiner* — Martha Tadesse
(74) *Attorney, Agent, or Firm* — Bookoff McAndrews, PLLC

(57) ABSTRACT

A temperature regulator may include a housing extending longitudinally from a first, open end to a second, closed end. The housing may include an outer wall, an inner wall disposed radially inward from the outer wall, and an insulating medium disposed between the outer wall and the inner wall, wherein the insulating medium is a vacuum-sealed chamber having air substantially removed therefrom.

18 Claims, 8 Drawing Sheets

(56) References Cited

U.S. PATENT DOCUMENTS

| | | | | | |
|---|---|---|---|---|---|
| 7,089,749 | B1 * | 8/2006 | Schafer | B60H 1/00264 | 62/3.2 |
| 2004/0140304 | A1 * | 7/2004 | Leyendecker | A47J 36/2433 | 219/386 |
| 2007/0017246 | A1 * | 1/2007 | Hoare | F25D 3/08 | 62/457.8 |
| 2007/0084236 | A1 * | 4/2007 | Panganiban | F25D 3/08 | 62/457.3 |
| 2009/0038317 | A1 * | 2/2009 | Otey | F25B 21/04 | 62/3.2 |
| 2011/0146743 | A1 * | 6/2011 | Oesterle | F01N 5/025 | 136/210 |
| 2012/0217772 | A1 * | 8/2012 | Tang | B60N 3/104 | 297/188.01 |

* cited by examiner

PORTABLE TEMPERATURE REGULATION DEVICES USING HEAT TRANSFER DEVICES

CROSS-REFERENCE TO RELATED APPLICATION(S)

This patent application claims the benefit of priority under 35 U.S.C. §119 to U.S. Provisional Patent Application No. 62/280,404, filed on Jan. 19, 2016, the entirety of which is incorporated herein by reference.

TECHNICAL FIELD

Various embodiments of the present disclosure relate generally to a portable temperature regulation device that actively maintains a container and/or liquid at a desired temperature. More specifically, exemplary embodiments of the present disclosure relate to coolers/heaters using heat transfer devices configured to actively regulate the temperature of containers and/or liquids by adding or withdrawing heat from the containers and/or liquids.

BACKGROUND

Many people prefer that certain liquids, e.g., water, soda, juice, milk, and beer, are cold while being consumed. Conversely, many people prefer that other beverages, e.g., coffee, tea, etc. are warm while being consumed. The vast majority of beverage containers, however, are not well-insulated, and the beverages they contain rapidly rise or fall in temperature after being brought to the desired temperature, particularly when the ambient temperature is substantially different from that of the beverage and/or when the beverage container is exposed to sunlight or other factors. This can lead to less enjoyable beverage consumption and/or wasted beverages. Similar concerns exist with respect to food, medical products, and any other materials desired to be kept at particular temperatures. Various devices, such as insulated container sleeves and thermoses, have been developed, but these passive devices are highly ineffective. Other devices such as microwaves and refrigerators have been developed, but these active devices are expensive, impractical, and non-portable.

Accordingly, a need exists for a portable system for effectively and predictably maintaining containers and/or liquids at desired temperatures without the drawbacks of the prior art.

BACKGROUND

In one aspect, the present disclosure is directed to a temperature regulator. The temperature regulator may include a housing extending longitudinally from a first, open end to a second, closed end. The housing may include an outer wall, an inner wall disposed radially inward from the outer wall, and an insulating medium disposed between the outer wall and the inner wall, wherein the insulating medium is a vacuum-sealed chamber having air substantially removed therefrom. The temperature regulator may also include a resilient member extending around at least a portion of the inner wall and extending radially inward from the inner wall, the resilient member being fixed only to the inner wall at a first end disposed closer to the first end of the cylindrical housing than the second end of the cylindrical housing, the resilient member extending from the first end to a second end disposed closer to the second end of the cylindrical housing than to the first end of the cylindrical housing, the second end of the resilient member being unsecured to the inner wall of the cylindrical housing, the resilient member having a wavy configuration that includes one or more peaks and valleys, the one or more peaks being configured to directly contact an outer surface of at least a first container or a second container disposed within the temperature regulator, the one or more valleys directly contacting the inner wall of the cylindrical housing, wherein the resilient member is configured to move between a relaxed configuration and a plurality of radially compressed configurations. The resilient member may compress by a first radial distance, and the second end of the resilient member may extend longitudinally toward the second end of the cylindrical housing by a first longitudinal distance, when the first container having a first diameter is inserted into the temperature regulator. The resilient member may compress by a second radial distance, and the second end of the resilient member may extend longitudinally toward the second end of the cylindrical housing by a second longitudinal distance, when the second container having a second diameter greater than the first diameter is inserted into the temperature regulator, wherein the second radial distance and the second longitudinal distance are greater than the first radial distance and the second longitudinal distance, respectively. The resilient member may apply a spring force radially inward when either the first container or the second container is inserted into the temperature regulator to secure the first container or second container within the temperature regulator. The temperature regulator may include a heat transfer device having a radially inward-facing surface coupled to the inner wall, and a radially outward-facing surface, the heat transfer device being configured to transfer heat from the inner wall to the radially-outward facing surface. The temperature regulator may include a heat exchange element coupled to both the radially outward-facing surface of the heat transfer device, and the outer wall. The heat exchange element may be coupled to the outer wall at spaced apart locations, wherein the heat exchange element is configured to transfer heat from the radially-outward facing surface of the heat transfer device to the outer wall at the spaced apart locations.

The temperature regulator may further include a controller, and one or more temperature sensors coupled to the controller and configured to measure a temperature of the outer wall, wherein the controller receives input from the one or more temperatures to determine a temperature of outer wall or a rate of change of the temperature of outer wall, and controls the one or more heat transfer devices based on the determined temperature or determined rate of change of temperature.

In another aspect, the present disclosure is directed to a temperature regulator comprising a housing having an outer wall, an inner wall disposed radially inward from the outer wall, an insulating medium disposed between the outer wall and the inner wall, and an opening. The temperature regulator may also include one or more heat transfer devices configured to transfer heat from the inner wall to the outer wall, and one or more heat exchange elements disposed between the one or more heat transfer devices, and the inner wall or the outer wall.

The insulating medium may be a vacuum-sealed chamber substantially devoid of air. The vacuum-sealed chamber may have a rating from 200-50,000 micron. The one or more heat transfer devices may be thermoelectric devices. Each of the one or more heat transfer devices may be directly coupled to a radially outward-facing surface of the inner wall. The one or more heat exchange elements may be coupled to both a radially outward-facing surface of at least one heat transfer device, and the outer wall, the one or more heat exchange elements being coupled to the outer wall at spaced apart locations, wherein the one or more heat exchange elements are configured to transfer heat from the radially-outward facing surface of the at least one heat transfer device to the outer wall at the spaced apart locations. The one or more heat exchange elements may be directly coupled to at least two heat exchange elements, and undulate between peaks that are directly coupled to a radially inward-facing surface of the outer wall and valleys that are directly coupled to radially outward-facing surfaces of the at least two heat exchange elements. The one or more heat transfer devices may be directly coupled to a radially inward-facing surface of the outer wall. The temperature regulator may include one or more heat exchange elements coupled to both a radially outward-facing surface of the inner wall at spaced apart locations and to a radially inward-facing surface of at least one heat transfer device, the one or more heat exchange elements being configured to transfer heat from the spaced apart locations of the inner wall to the at least one heat transfer device. The temperature regulator may include a resilient member extending around a portion of the inner wall and extending radially inward from the inner wall. The resilient member may compress to a first extent when a first container having a first diameter is inserted into the temperature regulator, and may compress to a second extent greater than the first extent when a second container having a second diameter greater than the first diameter is inserted into the temperature regulator. The resilient member may apply a spring force radially inward when either the first container or the second container is inserted into the temperature regulator to secure the first container or second container within the temperature regulator. The temperature regulator may include a controller, and one or more temperature sensors coupled to the controller and configured to measure a temperature of the outer wall. The controller may receive input from the one or more temperatures to determine a temperature of the outer wall or a rate of change of the temperature of the outer wall, and controls the one or more heat transfer devices based on the determined temperature or determined rate of change of temperature. The controller may be configured to shut down the one or more heat transfer devices if the temperature of the outer wall exceeds a threshold. The threshold may be from 100 and 120° F. The housing may be configured to receive and regulate the temperature of one or more of a medical, medicinal, or bodily fluid. The medical, medicinal, or bodily fluid may include one or more of insulin, an antibiotic, hemophilia factor, blood, or plasma. The housing may be configured to receive and regulate the temperature of food solids.

In yet another aspect, the present disclosure is directed to a temperature regulator comprising a housing having an outer wall, an inner wall disposed radially inward from the outer wall, an insulating medium disposed between the outer wall and the inner wall, and an opening. The temperature regulator may include one or more thermoelectric devices configured to transfer heat from the inner wall to the outer wall, a controller, and one or more temperature sensors coupled to the controller and configured to measure a temperature of the outer wall, wherein the controller receives input from the one or more temperatures to determine a temperature of outer wall or a rate of change of the temperature of outer wall, and controls the one or more thermoelectric devices based on the determined temperature or determined rate of change of temperature.

The controller may be configured to shut down the one or more thermoelectric devices if the temperature of the outer wall exceeds a threshold temperature from 100 and 120° F.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DESCRIPTION OF THE EMBODIMENTS

Reference will now be made in detail to the exemplary embodiments of the disclosure, examples of which are illustrated in the accompanying drawings. Wherever possible, the same reference numbers will be used throughout the drawings to refer to the same or like parts.

In general, the present disclosure is directed to temperature regulation devices having active cooling or heating mechanisms, such as, e.g., thermoelectric devices or other active heat transfer devices. The disclosed temperature regulator may be portable, and may draw energy from sustainable, renewable, and/or rechargeable energy sources. Devices of the present disclosure may be configured to accommodate various types of containers including, but not limited to, aluminum cans or bottles, glass bottles, plastic bottles, plastic cups, paper cups, Styrofoam cups, Tetra Pak® dispensers, or any other suitable container. The present application may also be applicable to food containers, coolers, plastic containers, and other insulated containers such as, e.g., medical containers for carrying various medical, medicinal, or bodily fluids. Exemplary bodily fluids that may be cooled by embodiments of the present disclosure include, but are not limited to, blood and/or plasma.

Figure 2:
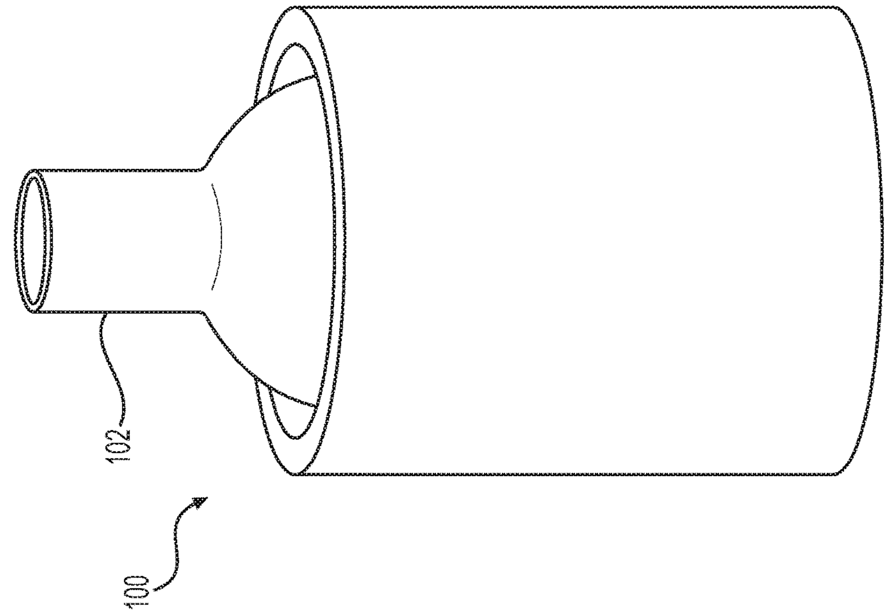
FIG. 2 is a perspective view of a container disposed within the temperature regulator of FIG. 1.
Figure 1:
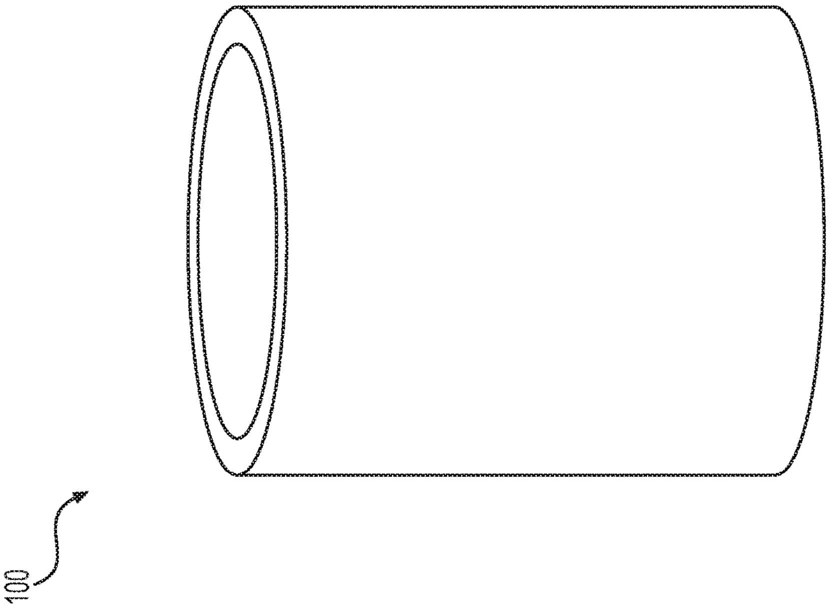
FIG. 1 is a perspective view of an exemplary temperature regulator according to an embodiment of the present disclosure.

FIG. 1 is a perspective view of an exemplary temperature regulator 100 consistent with the present disclosure. It should be appreciated that the device depicted in FIG. 1 is merely illustrative in nature, and is not limiting of the present disclosure. Temperature regulator 100 may be configured to receive any suitable container 102 containing a liquid, such as, e.g., a liquid beverage, other liquid, gel, or solid. The liquid may be any beverage desired to be kept cool or warm, such as, e.g., water, juice, soda, beer, soup, or the like. In other examples, the liquid may be a medical, medicinal, or bodily liquid, such as, e.g., blood and/or plasma. In yet another embodiment, temperature regulator 100 may be used to regulate the temperature of one or more solids (including, but not limited to food solids), or one or more solids suspended in a gel or liquid. For example, temperature regulator 100 may be used to maintain the temperature of transplanted organs suspended in a liquid or gel. The medicinal product to be stored could be one or more of insulin, interferon, antibiotics, hemophilia factor, or any other medicinal product that may require temperature control for storage and transport.

Figure 3A:
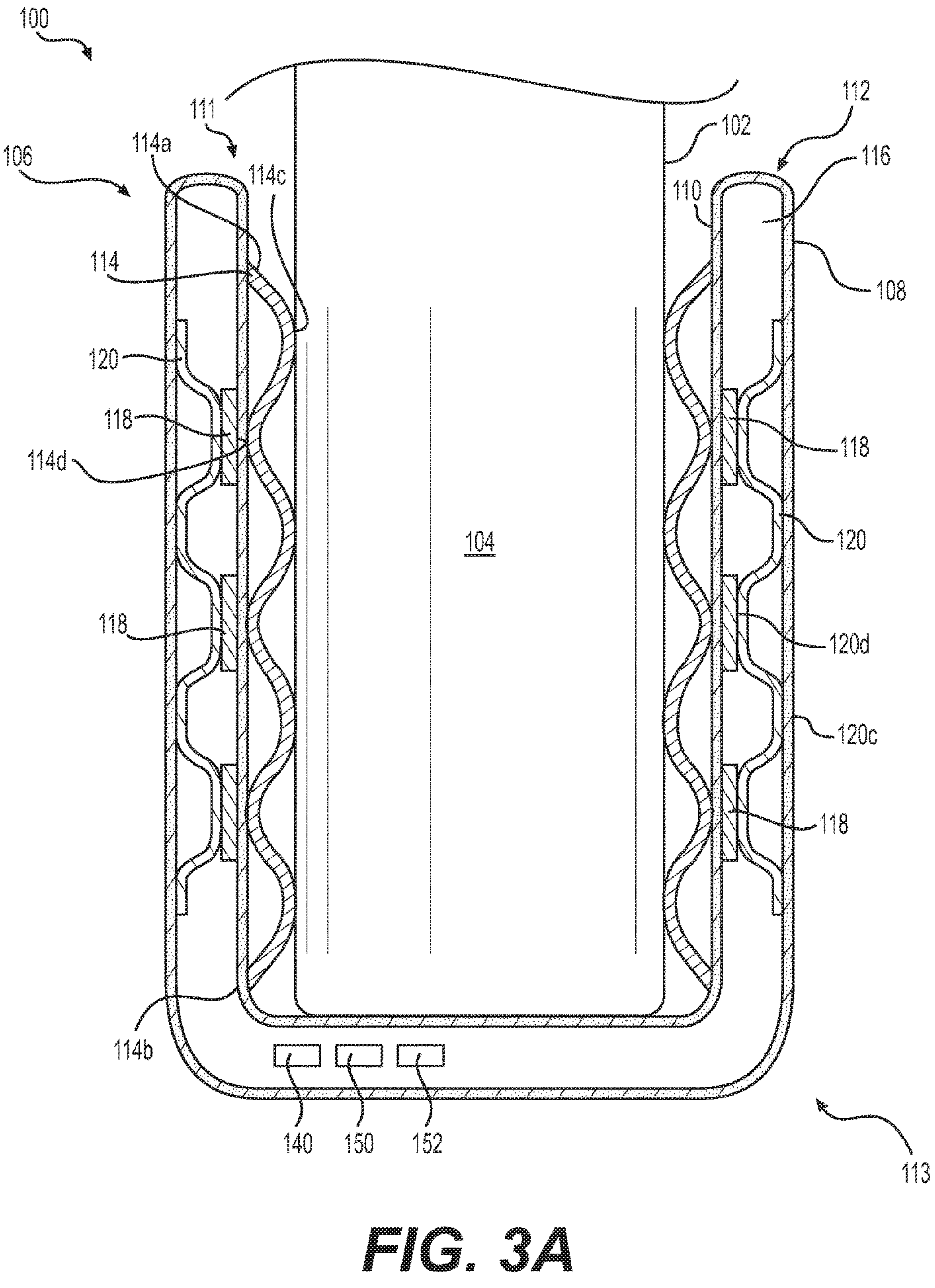
FIG. 3A is a cross-sectional view of an exemplary temperature regulator including heat transfer devices according to an embodiment of the present disclosure.

FIG. 3A depicts a cross-sectional view of temperature regulator 100 including a housing 106 having a first or outer wall 108 and a second or inner wall 110 that is disposed radially inward from the outer wall 108. Housing 106 may be generally cylindrical and may have an opening 111 disposed at a first or top end 112, and may include a closed second or bottom end 113. It is also contemplated that housing 106 may be formed in any other suitable shape to allow for a more complementary fit with various containers 102. In some examples, the inner wall 110 may be substantially cylindrical in order to accept standard cylindrical containers (e.g., cans and bottles), while the outer wall 108 may include one or more other shapes. Other shapes include, e.g., square, rectangular, triangular, and other suitable shapes. For example, outer wall 108 may include different ergonomic shapes and other features to provide a more comfortable gripping area for a user of temperature regulator 100. Outer wall 108 also may include various coatings and/or other surface features such as, e.g., polymeric coatings, tacky coatings, protrusions, and the like, in order to improve a user's grip and comfort while using temperature regulator 100.

Housing 106 may be formed of or otherwise include a material having a high thermal conductivity. Suitable materials for housing 106 include, e.g., aluminum, copper, gold, zinc, iron, stainless steel, other metals, and alloys of one or more metals. Suitable materials may also include nanomaterials, composites, and the like.

Temperature regulator 100 also may include a resilient member 114 configured to engage and secure container 102 within temperature regulator 100. Resilient member 114 may be formed from one or more of the same materials as housing 106. However, it is also contemplated that resilient member 114 may be formed from one or more different materials than housing 106. For example, resilient member 114 may be formed of aluminum, while housing 106 is formed of stainless steel.

Resilient member 114 may be coupled to inner wall 110 of housing 106. In some examples, resilient member 114 may extend around an entirety of a circumference of inner wall 110. In other examples, resilient member 114 may extend around only a portion of the circumference of inner wall 110. Further, only some portions of resilient member 114 may be directly coupled or fixed to inner wall 110. In one example, resilient member 114 may be coupled to inner wall 110 only at a first end 114*a* disposed adjacent to opening 111 at first end 112 of temperature regulator 100. In the embodiment shown in FIG. 3A, resilient member 114 may be a wavy or sinusoidal strip of material that extends from first end 114*a* toward a second end 114*b*. The second end 114*b* of resilient member 114 may be disposed closer to second end 113 of temperature regulator 100 than to first end 114*a* of resilient member 114. The second end 114*b* may be configured to slide longitudinally relative to inner wall 110, and may be unsecured to inner wall 110. Resilient member 114 may curve and/or undulate between one or more peaks 114*c* and valleys 114*d*, and thus may lie in multiple planes. The peaks 114*c* may be disposed farther away from inner wall 110 than from the valleys 114*d*. The peaks 114*c* may be configured to directly contact an outer surface of a container 102, while the valleys 114*d* may directly contact inner wall 110. In some embodiments, a portion of resilient member 114 may extend into and out of an opening in the inner wall 110 of temperature regulator 100 as resilient member 114 compresses and expands.

Figure 6:
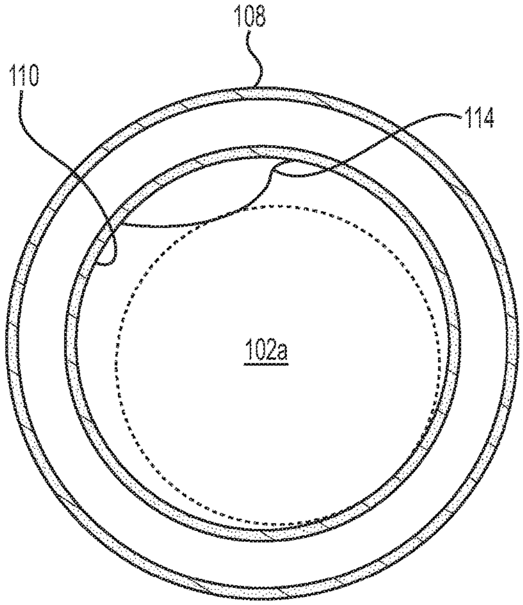
FIGS. 6 and 7 are top views of the temperature regulator of any of FIGS. 1-5, accommodating containers of different sizes.
Figure 7:
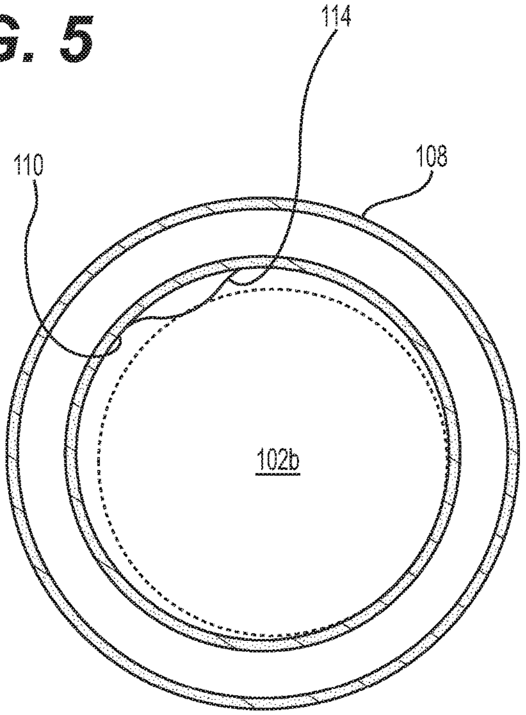

Resilient member 114 may be configured to move reciprocally between a relaxed configuration and a plurality of compressed configurations. That is, resilient member 114 may be spring-like in order to help temperature regulator 100 accommodate containers 102 having different sizes and diameters. For example, when a first container 102 having a first diameter (e.g., a 12 ounce aluminum can with a largest diameter of 2.6 inches) is inserted into temperature regulator 100, the outer surface of the first container 102 may contact resilient member 114, causing resilient member 114 to radially compress, and also causing second end 114*b* to extend further toward second end 113 of temperature regulator 100. The amount of radial compression and longitudinal extension caused by a given container 102 may depend on the diameter of the container 102. For example, when a second container 102 having a second diameter less than the first diameter (e.g., a 16.9 ounce plastic bottle having a largest diameter of 2.5 inches) is inserted into temperature regulator 100, resilient member 114 may exhibit a smaller amount of radial compression and longitudinal extension than when the larger 2.6 inch diameter can is inserted into the temperature regulator 100. When fully compressed, resilient member 114 may be compressed and extended such that it closely approximates the shape of inner wall. For example, when a container 102 has a diameter that is substantially the same as that of inner wall 110, then resilient member 114 may be compressed to such an extent that it is nearly flush with inner wall 110. FIGS. 6 and 7 illustrate the varying levels of compression that resilient member 114 may exhibit when accommodating various container sizes. For example, in FIG. 6, a container 102*a* having a first diameter is shown inserted into substantially the same 100 and compressing resilient member 114. FIG. 7 shows the same substantially the same 100 having a different container 102*b* inserted therein. Container 102*b* has a second and larger diameter than that of container 102*a*, and thus compresses the resilient member 114 to a greater extent than container 102*a* does.

Housing 106 may include an insulating medium 116 disposed between outer wall 108 and inner wall 110. In one example, the insulating medium 116 may be a vacuum that is substantially devoid of air. In one example, the outer wall 108 and inner wall 110 create a sealed space. This space can be vacated of atmosphere to form a vacuum via multiple methods, which may include drawing a vacuum on the space using a vacuum pump or sealing the inner and outer walls 110 and 108 while they are in a vacuum themselves. In one example, a vacuum pump is connected to a port (not shown) formed into either the inner wall 110 or outer wall 108. After drawing the air from the space, the port is permanently sealed off, thereby maintaining the vacuum between the sealed inner and outer walls 110 and 108. A deeper vacuum may create a more efficient thermal barrier. However, it may not be practical to draw the space to a perfect vacuum of 0 micron. Thus, a vacuum of, e.g., 200 micron may be utilized and may be easily achievable with a standard refrigeration grade vacuum pump. Other suitable micron ratings may be utilized, such as, e.g., from 200 micron to 50,000 micron. A vacuum of 50,000 micron may be easily achievable, and still provide sufficient thermal barrier for many applications. However, a better micron rating, such as, e.g., a 200 micron rating, would provide better insulation. The vacuum may substantially reduce the ability of heat from the outer wall 108 to transfer back to the inner wall 110, thereby helping to keep the inner wall 110, container 102, and liquid 104, at cooler temperatures. If the insulating medium 116 includes air, heat may be transferred from hotter outer wall 108 to inner wall 110 by conduction, convection, and radiation. However, when insulating medium 116 is a vacuum, heat may be transferred from outer wall 108 to inner wall 110 by radiation only. That is, when insulating medium 116 is a vacuum, heat transfer from outer wall 108 to inner wall 110 by conduction and convection may be substantially negligible.

Insulating medium 116 may include other insulating materials instead of a vacuum, such as, e.g., photonic crystals or other suitable materials. A vacuum may substantially eliminate conduction and convection heat transfer, thereby causing radiation transfer to be the dominant mode of heat transport. Photonic crystals may include a band gap that can eliminate propagation of a certain frequency ranges of light. A thermal radiation barrier is thus achievable using photonic crystals. In some examples, temperature regulator 100 may include both a vacuum and an insulating material such as photonic crystal structures. The use of both a vacuum and another insulating material can provide advantages for other applications, such as, e.g., military applications and health care application (e.g., maintaining a blood sample at a cool temperature for a prolonged period of time). A filler material such as fiberglass or foam insulation may be used to allow all three modes of heat transport (convection, conduction and radiation), in some cases. However, use of a filler material may not be optimal as it may reduce thermal isolation of the two walls, and reduce the cooling effect of the temperature regulator 100. In some examples, it may be important to reduce as much heat transfer between the inner and outer walls as possible for the design to work efficiently. In some examples, the inner and outer walls 110 and 108 may be formed from a material such as stainless steel due to its strength and corrosion resistance capabilities. The strength would enable the inner and outer walls to maintain their integrity with a vacuum in the space between them.

Figure 4:
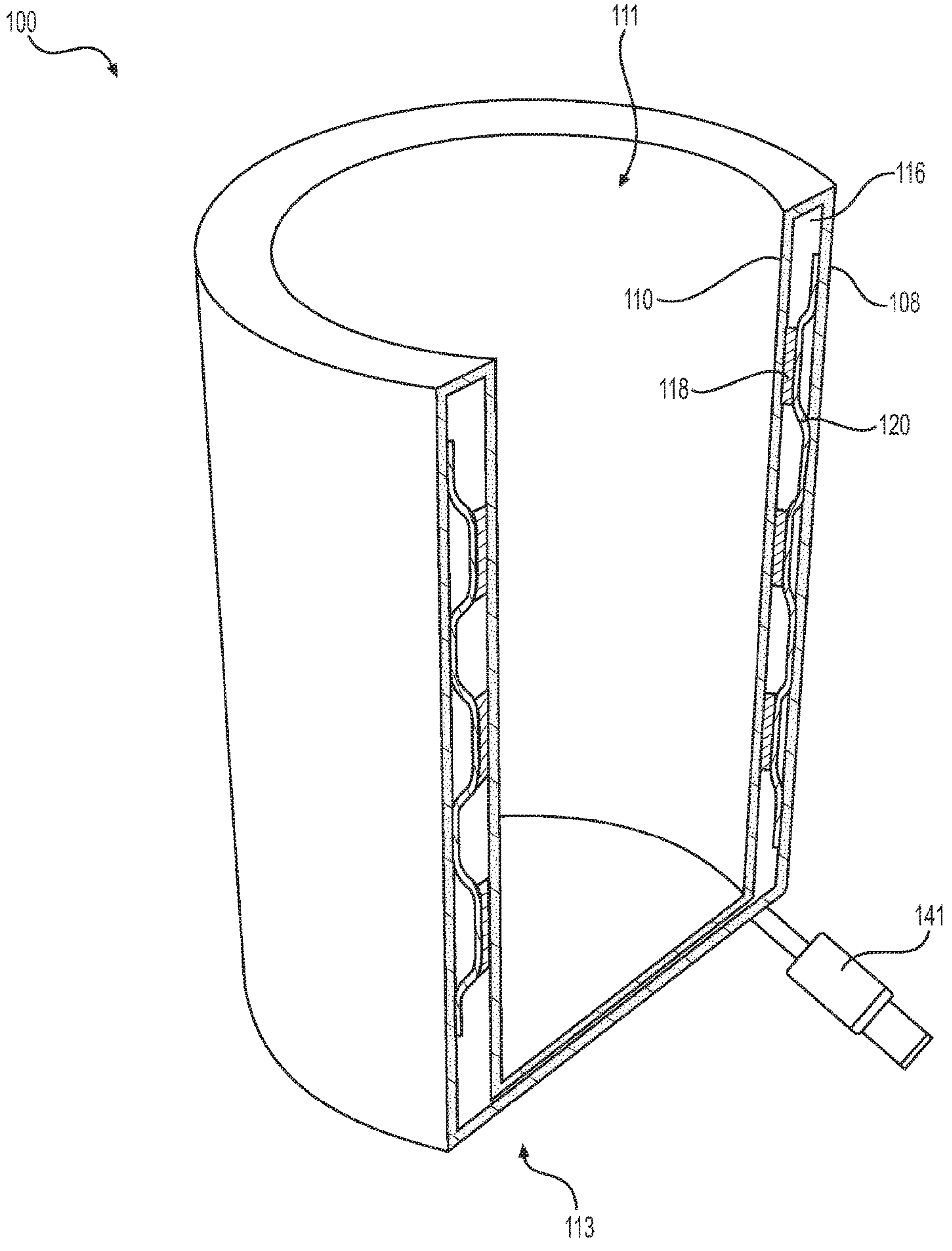
FIG. 4 is a perspective and cut-away view of the temperature regulator of any of FIGS. 1,2, and 3A.
Figure 11:
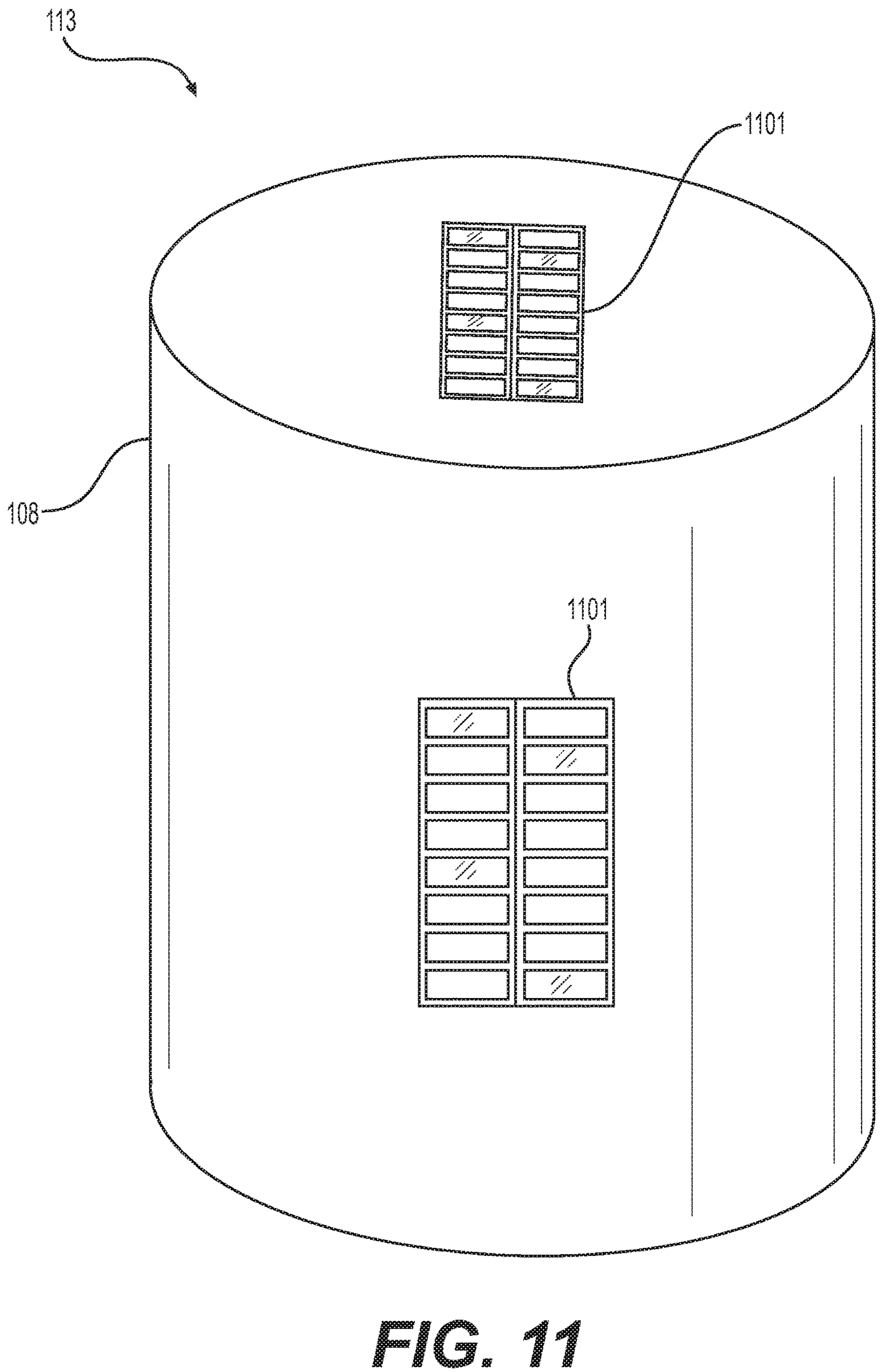
FIG. 11 is a perspective view of a temperature regulator with solar panels according to an embodiment of the present disclosure.

Temperature regulator 100 may include one or more heat transfer devices 118 coupled to a radially outward-facing side of inner wall 110. The heat transfer devices 118 may be thermoelectric devices that leverage the Peltier effect to transfer heat from a radially inward-facing side to a radially outward-facing side of the heat transfer device 118 in order to keep liquid 104 cool. In some embodiments, heat transfer device 118 may operate in a reverse manner so as to heat container 102 by reversing the gradient of heat flow through the heat transfer device 118. The heat transfer device 118 may be a heat pump, and may be powered by electrical energy from an energy source 140. In some examples, energy source 140 may be a rechargeable battery, which can be charged via any suitable charging mechanism, such as, e.g., a USB port, AC/DC port, a solar panel 1101 (shown in FIG. 11), or the like. As shown in FIG. 11, temperature regulator 100 may include one or more solar panels 1101 disposed on the circumferential outer surface 108 of temperature regulator 100, or on the bottom of temperature regulator 100. It is contemplated that solar panels 1101 may be incorporated in any other suitable location, and may be detachable from temperature regulator 100. An energy transfer cable 141 (shown only in FIG. 4) may be removably coupled to temperature regulator 100 to enable charging of an energy source. In other examples, an energy source may be charged by wireless or inductive mechanisms, or by a thermoelectric generator. Temperature regulator 100 may include any suitable number of heat exchange devices 118 that may be longitudinally or circumferentially spaced from one another.

As shown in FIG. 3A, temperature regulator 100 also may include one or more heat exchange elements 120 that are in thermal communication with both heat transfer devices 118 and outer wall 108. Similar to resilient member 114, heat exchange elements 120 may be wavy strips of thermally conductive material configured to transfer heat from the radially outward-facing surface of heat transfer devices 118 to outer wall 108. In one example, heat exchange elements 120 may curve and/or undulate between one or more peaks 120*c* and valleys 120*d*. The peaks 120*c* may be disposed further away from inner wall 110 than the valleys 114*d*. The peaks 120*c* may be configured to directly contact outer wall 108, while the valleys 120*d* may directly contact the radially outward-facing surface of heat transfer devices 118. Heat exchange elements 120 may conduct heat toward spaced apart portions of outer wall 108 in order to prevent any one portion of outer wall 108 from reaching unsafe temperatures or temperatures uncomfortable to touch. The heat exchange element 120 may provide a path for heat transport to the outer wall 108 from the heat transfer device 118. A thermally conductive material, such as copper, would be a suitable material and transport mechanism. Due to its malleability, heat exchange element 120 can be coupled to the heat transfer device 118, and also form thermal contact with the outer wall 108. Thus, heat exchange element 120 may essentially act as a thermal spring forming to any irregularities or surface changes in the outer wall. In some examples, a wavy element as shown in FIG. 1, or even a coiled heat exchange element 120 may be utilized, provided the heat exchange element 120 does not make contact with the inner wall 110. A wavy heat exchange element may provide the optimal surface contact with the outer wall 108.

Figure 5:
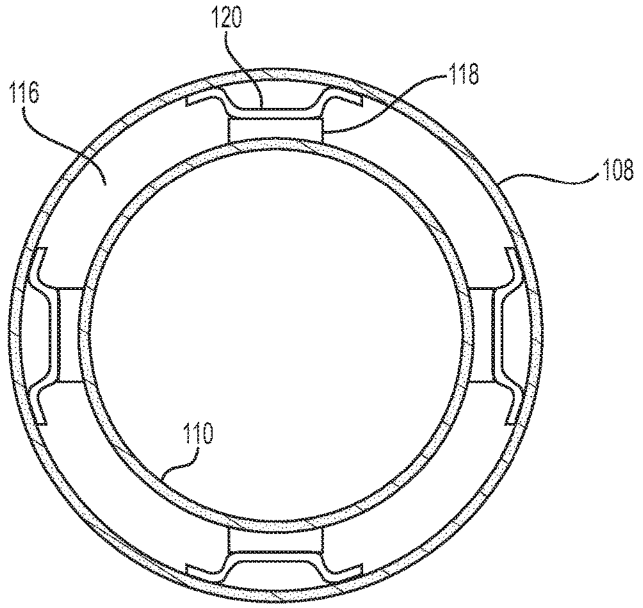
FIG. 5 is a top cross-sectional view of the temperature regulator of any of FIGS. 1,2, 3A, and 4.

As shown in FIG. 5, heat exchange devices 118 may be circumferentially spaced from one another about temperature regulator 100. In the embodiment shown in FIG. 5, heat exchange devices 118 are spaced apart from one another by 90 degrees. However, it is contemplated that other suitable spacing, such as, e.g., 30 degrees, 45 degrees, 75 degrees, 120 degrees, or 180 degrees may be utilized. In other embodiments, the circumferential spacing between adjacent heat exchange devices may not be uniform. For example, one pair of adjacent heat exchange devices 118 may be spaced apart from one another by a first circumferential arc, e.g., 90 degrees, while a second pair of adjacent heat exchange devices 118 may be spaced apart from one another by a second circumferential arc that is different than the first circumferential arc, e.g., 75 degrees.

Figure 8:
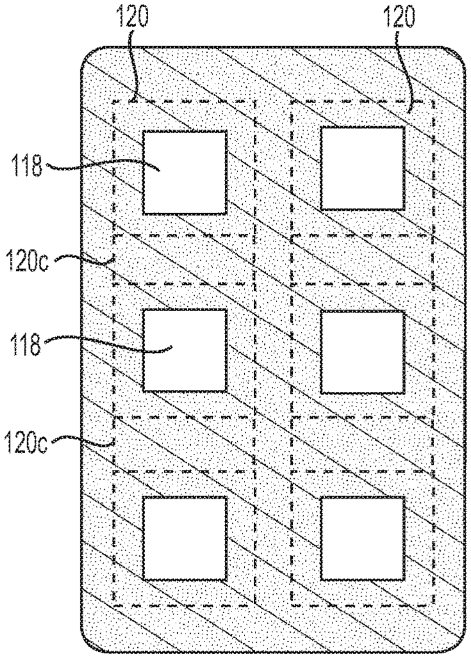
FIGS. 8-10 are exemplary front and cut-away views of temperature regulators according to various embodiments of the present disclosure.
Figure 9:
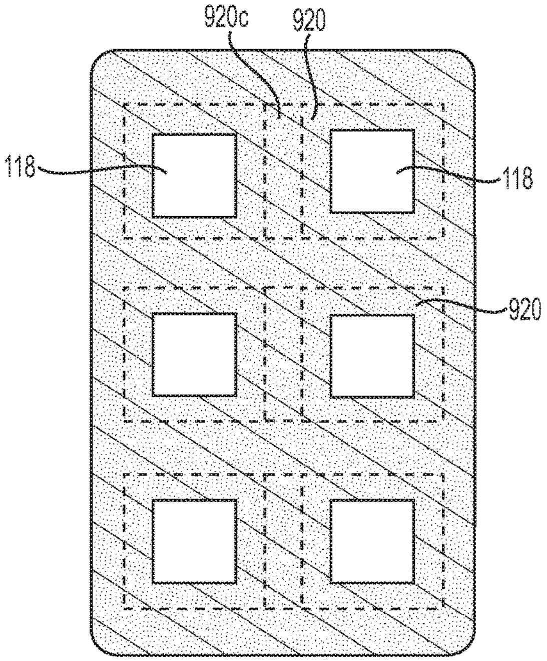
Figure 10:
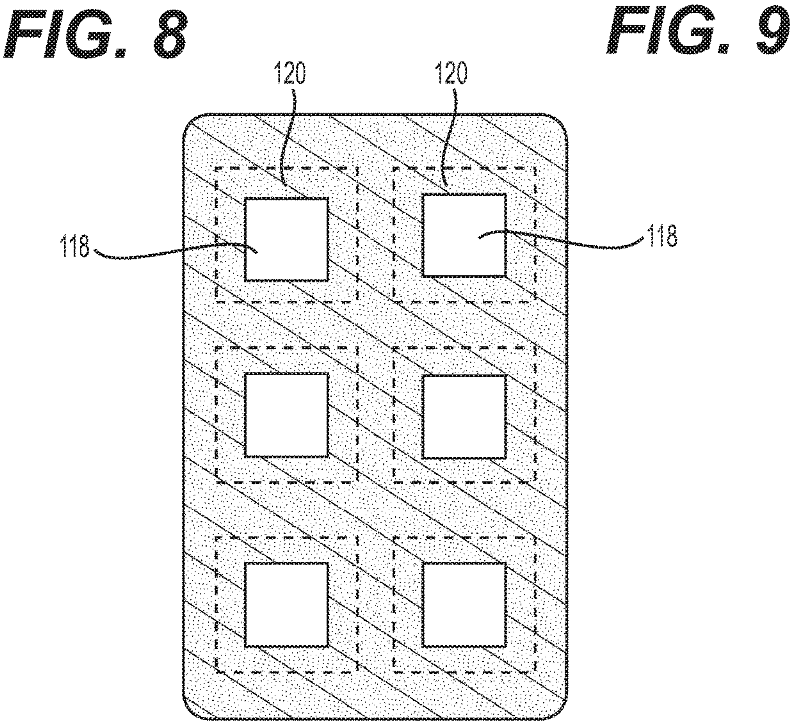

FIGS. 8-10 show various front and cut-away views of temperature regulator 100 with different configurations of heat exchange devices 118 and heat exchange elements 120. In the examples of FIGS. 8-10, the dotted lines represent portions of heat exchange elements 120 or 920 that are in contact with outer wall 108. In FIG. 8, vertically adjacent heat exchange devices 118 may be positioned in a column and may be coupled to a single heat exchange element 120. That is, a single heat exchange element 120 may undulate between outer surface 108 and vertically adjacent heat exchange devices 118 of a column, thereby permitting heat to transfer from the heat exchange devices 118 to the outer wall 108. The peaks 120*c* of heat exchange element 120 that are in contact with outer wall 108 are disposed between vertically adjacent heat exchange devices 118. FIG. 9 depicts an embodiment of temperature regulator 100 in which circumferentially disposed adjacent heat exchange devices 118 may be coupled to a single, horizontally disposed heat exchange element 920. In this embodiment, a single heat exchange element 920 may undulate between outer surface 108 and circumferentially adjacent heat exchange devices 118. Peaks 920*c* of heat exchange element 920 may be disposed between circumferentially adjacent heat exchange devices 118 of a row. FIG. 10 depicts an embodiment of temperature regulator 100 in which adjacent heat exchange devices 118 are not connected to one another by a heat exchange element 120. That is, in the embodiment of FIG. 10, each heat exchange element 120 is in direct contact with only one heat exchange device 118.

In use, a user may place a container 102 through opening 111 into a volume defined by temperature regulator 100. The container 102 may radially compress and longitudinally and/or radially extend the resilient member 114, thereby securing the container 102 within temperature regulator 100. The user may activate the one or more heat transfer devices 118, via, e.g., an ON/OFF switch (e.g., a DPDT or other suitable switch, not shown), causing heat transfer devices 118 to withdraw heat from inner wall 110. In other examples, the compression of resilient member 114 may activate the heat transfer devices 118. When the heat transfer devices 118 are active, inner wall 110 may withdraw heat from resilient member 114, which may withdraw heat from container 102 and liquid 104. Thus, heat may transfer from liquid 104, through container 102, resilient member 114, inner wall 110, and through heat transfer devices 118. The withdrawn heat may travel from the outer radial surface of heat transfer device 118, to heat exchange elements 120, and to outer surface 108. Outer surface 108 may act as a heat sink for heat withdrawn from liquid 104, and may ultimately transfer that heat to the atmosphere.

During use of temperature regulator 100, the radially inward-facing surface of heat exchange device 118 may be the lowest temperature zone of temperature regulator 100. The temperature of the inner wall 110, the resilient member 114, container 102, and liquid 104 may each be higher than the temperature of the radially inward-facing surface, i.e., the cooling surface, of heat transfer device 118. On the contrary, the radially outward-facing surface of heat transfer device 118 may be the highest temperature zone of temperature regulator 100. Heat exchange device 120 and outer wall 108 may each have a lower temperature than the radially outward-facing surface of heat transfer device 118. Heat may be transferred from outer wall 108 to the atmosphere.

Figure 12:
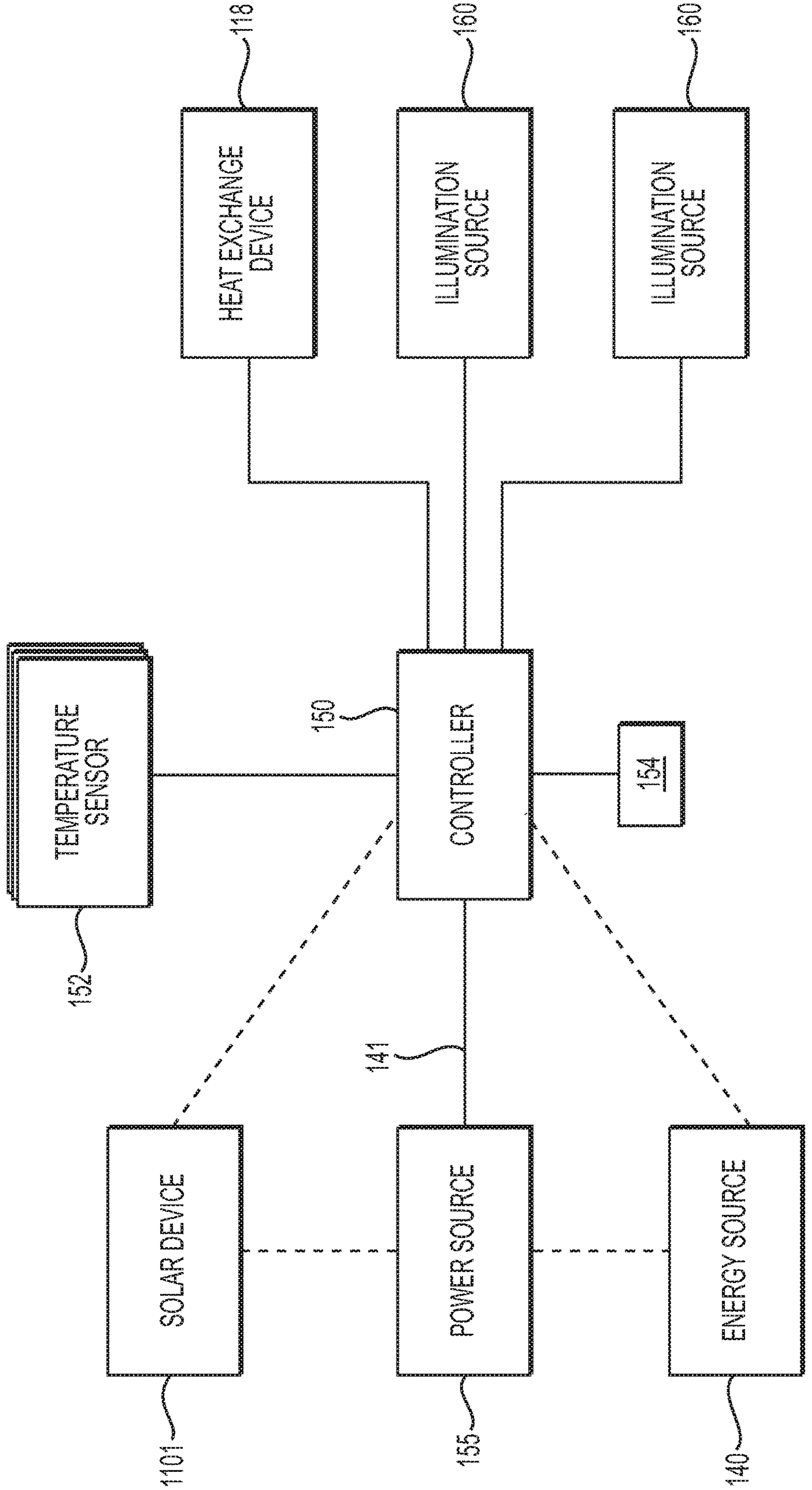
FIG. 12 is a schematic illustration of various components of a temperature regulator according to an embodiment of the present disclosure.

Referring to FIGS. 3A and 12, temperature regulator 100 may include a controller 150 coupled to the one or more heat transfer devices 118 and/or energy sources 140. Controller 150 may be powered directly by a power source 155, such as, e.g., a USB power source, an AC/DC outlet, or the like, directly via energy transfer cable 141 or by inductive means that bypass energy source 140. In other examples, controller 150 may be powered directly by one or more solar devices 1101. It is further contemplated that energy source 140 may be charged via solar devices 1101 or power source 155 simultaneous with the operation of controller 150. Again, it should be appreciated that temperature regulator 100 may be a food cooler, wine storage, other insulated container, or the like. The controller 150 may be coupled to one or more temperature sensors 152 (e.g., thermocouples) that are configured to measure a temperature of outer wall 108. The controller 150 may include a processor that is generally configured to accept information from the system and system components, and process the information according to various algorithms to produce control signals for controlling heat transfer devices 118 and/or energy sources 140. The processor may accept information from the system and system components, including from temperature sensors 152, and process the information according to various algorithms. The processor may be a digital IC processor, analog processor, or any other suitable logic or control system that carries out the control algorithms.

Controller 150 may include control algorithms to prevent the temperature of outer wall 120 from reaching unsafe temperatures, e.g., temperatures that may burn a user's hand or otherwise cause discomfort for the user. The controller 150 may utilize a temperature of outer wall 108, a rate of change of the temperature of outer wall 108, or some combination, to control whether heat transfer devices 118 are active. If, for example, the measured temperature of outer wall 108, or if the rate of temperature change of outer wall 108 exceeds certain thresholds, controller 150 may shutdown heat transfer devices 118 until the temperature of outer wall 108 falls below the threshold. In some examples, a threshold temperature may be between 100 and 120° F.

In other embodiments, temperature regulator 100 may include one or more LEDs or illumination sources 160. For example, temperature regulator 100 may include one or more blue LEDs that may give the user a visual representation of a cooling effect. In other examples, temperature regulator 100 may include one or more red LEDs that may give the user a visual representation of a heating effect. Other colors also may be utilized. Temperature regulator 100 also may include a closure configured to cover the opening 111 of temperature regulator 100. The closure may be, for example, a screw type cap having threads on an inner surface that are complementary to threads disposed on temperature regulator 100. By using a closure, temperature regulator 100 may be used to transport a container 102, and provide the ability of temperature regulator 100 to cool or heat a substance (e.g., a liquid) at an even faster rate. That is, when a closure is engaged with temperature regulator 100, it may substantially prevent heat from entering (or alternatively, leaving) any substance (e.g., liquid) or container disposed within temperature regulator 100. Thus, when heat transfer devices 118 withdraw heat from the mostly closed system, any substance (e.g., liquid) or container disposed within temperature regulator 100 may cool at a faster rate than if the closure were not engaged with temperature regulator 100. In some examples, heat transfer devices 118 may not be placed near the upper edge, first end 112 of temperature regulator 100, where the inner and outer walls 110 and 108 join (i.e., where thermal communication between the inner and outer walls 110 and 108 may occur). This thermal communication at the mating connection between the inner and outer walls 110 and 108 can be minimized by the use of an insulating wafer (not shown) disposed between or at the point of junction of inner and outer walls 110 and 108. The insulating wafer may be a thermal barrier that prevents excessive heat transport between the inner and outer walls 110 and 108.

Figure 3B:
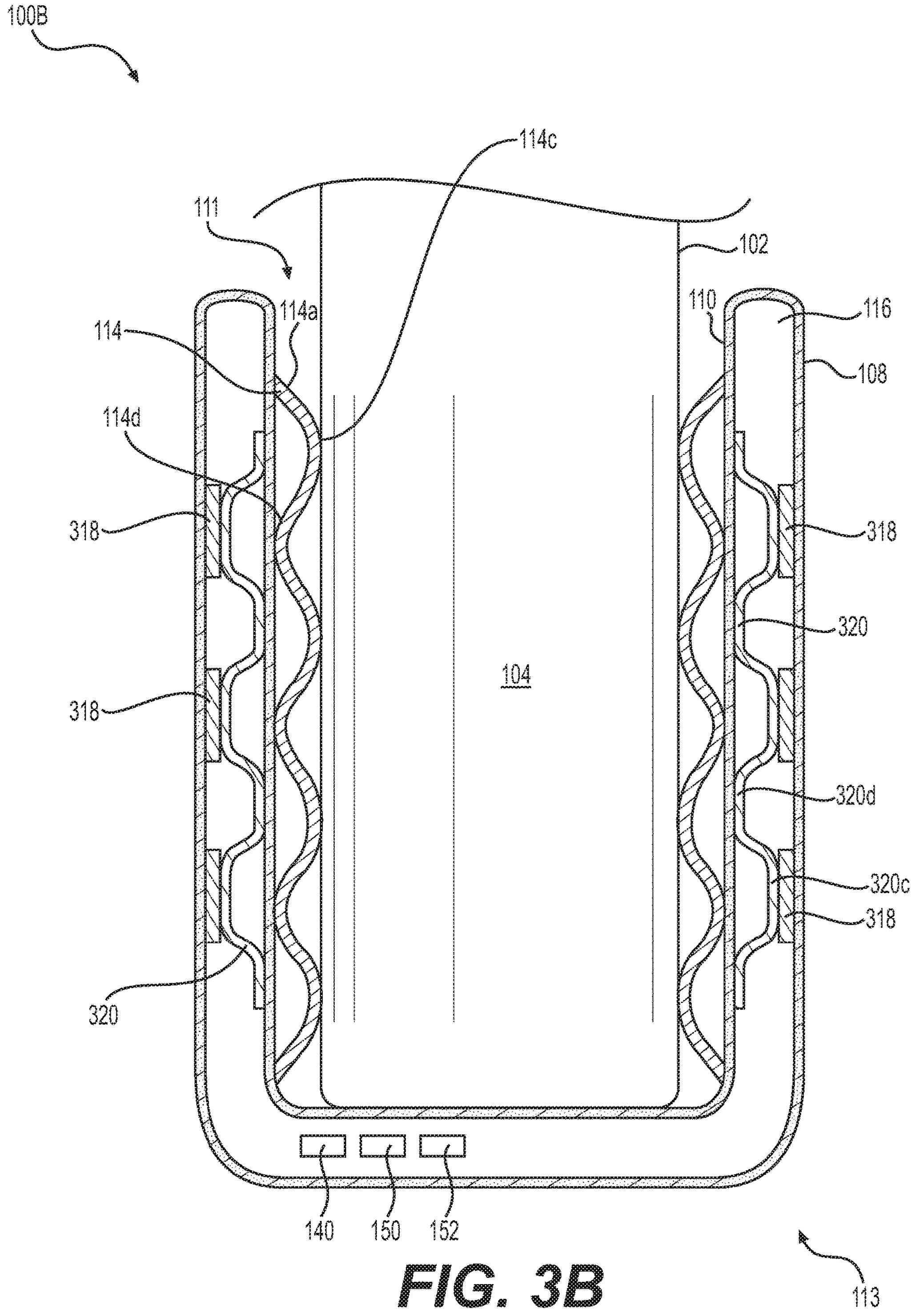
FIG. 3B is a cross-sectional view of an exemplary temperature regulator including heat transfer devices according to another embodiment of the present disclosure.

FIG. 3B shows a temperature regulator 100B, which may be substantially similar to temperature regulator 100, except that temperature regulator 100B may include heat exchange devices 318 and heat exchange elements 320 instead of heat exchange devices 118 and heat exchange elements 120. In this example, heat transfer devices 318 are substantially similar to heat exchange devices 118 described above, except that they are coupled to the radially inward-facing side of outer wall 108 as opposed to the radially outward-facing side of inner wall 110. The heat transfer devices 318 may utilize a Peltier effect to transfer heat from container 102 via inner wall 110 and heat exchange elements 320 to the radially outward-facing side of the heat transfer device 118 in order to keep liquid 104 cool or warm.

Heat exchange elements 320 may be substantially similar to heat exchange elements 120, except that they may be directly coupled to the radially outward-facing side of inner wall 110, and to a radially inward-facing side of heat exchange devices 318. Heat exchange elements 320 may curve and/or undulate between one or more peaks 320*c* and valleys 320*d*. The peaks 320*c* may be disposed further away from inner wall 110 than the valleys 320*d*. The peaks 320*c* may be configured to directly contact the radially inward-facing side of heat exchange devices 318, while the valleys 320*d* may directly contact the radially outward-facing side inner wall 110. Heat exchange elements 320 may provide paths for heat transport from inner wall 110 to the heat exchange device 318.

Other embodiments of the disclosure will be apparent to those skilled in the art from consideration of the specification and practice of the disclosure herein. It is intended that the specification and examples be considered as exemplary only, with a true scope and spirit of the disclosure being indicated by the following claims.

What is claimed is:

1. A temperature-regulating container comprising:

a housing extending longitudinally from a first, open end to a second, closed end, the housing including:

an outer wall, an inner wall disposed radially inward from the outer wall, and an insulating medium disposed between the outer wall and the inner wall, wherein the insulating medium is a vacuum-sealed chamber having air substantially removed therefrom;

a resilient member extending around at least a portion of the inner wall and extending radially inward from the inner wall, the resilient member being fixed only to the inner wall at a first end disposed closer to the first end of the housing than the second end of the housing, the resilient member extending from the fixed end toward a second end disposed closer to the second end of the housing than to the first end of the housing, the second end of the resilient member being unsecured to the inner wall of the housing, the resilient member having a wavy configuration that includes one or more peaks and valleys, the one or more peaks being configured to directly contact an outer surface of at least a first container or a second container disposed within the temperature-regulating container, the one or more valleys directly contacting the inner wall of the housing, wherein the resilient member is configured to move between a relaxed configuration and a plurality of radially compressed configurations, wherein:

the resilient member compresses by a first radial distance, and the second end of the resilient member extends longitudinally toward the second end of the housing by a first longitudinal distance, when the first container having a first diameter is inserted into the temperature-regulating container;

the resilient member compresses by a second radial distance, and the second end of the resilient member extends longitudinally toward the second end of the cylindrical housing by a second longitudinal distance, when the second container having a second diameter greater than the first diameter is inserted into the temperature-regulating container, wherein the second radial distance and the second longitudinal distance are greater than the first radial distance and the second longitudinal distance, respectively; and the resilient member applies a spring force radially inward when either the first container or the second container is inserted into the temperature-regulating container to secure the first container or second container within the temperature-regulating container;

a heat transfer device having a radially inward-facing surface coupled to the inner wall, and a radially outward-facing surface, the heat transfer device being configured to transfer heat from the inner wall to the radially-outward facing surface; and a heat exchange element coupled to both the radially outward-facing surface of the heat transfer device, and the outer wall, the heat exchange element being coupled to the outer wall at spaced apart locations, wherein the heat exchange element is configured to transfer heat from the radially-outward facing surface of the heat transfer device to the outer wall at the spaced apart locations.

2. The temperature-regulating container of claim 1, further including a controller, and one or more temperature sensors coupled to the controller and configured to measure a temperature of the outer wall, wherein the controller receives input from the one or more temperature sensors to determine a temperature of the outer wall or a rate of change of the temperature of the outer wall, and controls the one or more heat transfer devices based on the determined temperature or determined rate of change of temperature.

3. A temperature-regulating container, comprising:

a housing extending from a first, open end to a second, closed end, the housing having an outer wall, an inner wall disposed radially inward from the outer wall, an insulating medium disposed between the outer wall and the inner wall, and an opening;

a resilient member extending around at least a portion of the inner wall and extending radially inward from the inner wall, the resilient member extending at least partially between the first end of the housing and the second end of the housing, the resilient member having a wavy configuration that includes one or more peaks and valleys the one or more peaks being configured to directly contact an outer surface of at least a first container or a second container disposed within the temperature-regulating container, the one or more valleys directly contacting the inner wall of the housing, wherein the resilient member is configured to move between a relaxed configuration and a plurality of radially compressed configurations, wherein:

the resilient member compresses by a first radial distance when the first container having a first diameter is inserted into the temperature-regulating container;

the resilient member compresses by a second radial distance when the second container having a second diameter greater than the first diameter is inserted into the temperature-regulating container, wherein the second radial distance is greater than the first radial distance; and the resilient member applies a spring force radially inward when either the first container or the second container is inserted into the temperature-regulating container to secure the first container or second container within the temperature regulating container;

one or more heat transfer devices configured to transfer heat from the inner wall to the outer wall; and one or more heat exchange elements disposed between the one or more heat transfer devices, and the inner wall or the outer wall.

4. The temperature-regulating container of claim 3, wherein the insulating medium is a vacuum-sealed chamber substantially devoid of air.

5. The temperature-regulating container of claim 4, wherein the vacuum-sealed chamber has a rating from 200-50,000 micron.

6. The temperature-regulating container of claim 3, wherein the one or more heat transfer devices are thermoelectric devices.

7. The temperature-regulating container of claim 3, wherein each of the one or more heat transfer devices is directly coupled to a radially outward-facing surface of the inner wall.

8. The temperature-regulating container of claim 7, wherein the one or more heat exchange elements are coupled to both a radially outward-facing surface of at least one heat transfer device, and the outer wall, the one or more heat exchange elements being coupled to the outer wall at spaced apart locations, wherein the one or more heat exchange elements are configured to transfer heat from the radially-outward facing surface of the at least one heat transfer device to the outer wall at the spaced apart locations.

9. The temperature-regulating container of claim 8, wherein the one or more heat exchange elements are directly coupled to at least two heat exchange elements, and undulate between peaks that are directly coupled to a radially inward-facing surface of the outer wall and valleys that are directly coupled to radially outward-facing surfaces of the at least two heat exchange elements.

10. The temperature-regulating container of claim 3, wherein the one or more heat transfer devices are directly coupled to a radially inward-facing surface of the outer wall, and the temperature-regulating container includes one or more heat exchange elements coupled to both a radially outward-facing surface of the inner wall at spaced apart locations and to a radially inward-facing surface of at least one heat transfer device, the one or more heat exchange elements being configured to transfer heat from the spaced apart locations of the inner wall to the at least one heat transfer device.

11. The temperature-regulating container of claim 3, further including a controller, and one or more temperature sensors coupled to the controller and configured to measure a temperature of the outer wall.

12. The temperature-regulating container of claim 11, wherein the controller receives input from the one or more temperatures to determine a temperature of the outer wall or a rate of change of the temperature of the outer wall, and controls the one or more heat transfer devices based on the determined temperature or determined rate of change of temperature.

13. The temperature-regulating container of claim 11, wherein the controller is configured to shut down the one or more heat transfer devices if the temperature of the outer wall exceeds a threshold from 100 and 120° F.

14. The temperature-regulating container of claim 3, wherein the housing is configured to receive and regulate the temperature of one or more of a medical, medicinal, or bodily fluid.

15. The temperature-regulating container of claim 14, wherein the medical, medicinal, or bodily fluid includes one or more of insulin, an antibiotic, hemophilia factor, blood, or plasma.

16. The temperature-regulating container of claim 3, wherein the housing is configured to receive and regulate the temperature of food solids.

17. A temperature-regulating container, comprising:

a housing extending from a first, open end to a second, closed end, the housing having an outer wall, an inner wall disposed radially inward from the outer wall, an insulating medium disposed between the outer wall and the inner wall, and an opening;

a resilient member extending around at least a portion of the inner wall and extending radially inward from the inner wall, the resilient member coupled to the inner wall at the first end disposed closer to the first end of the housing than the second end of the housing, the resilient member extending from the first end to the second end disposed closer to the second end of the housing than to the first end of the housing, the resilient member having a wavy configuration that includes one or more peaks and valleys, the one or more peaks being configured to directly contact an outer surface of at least a first container or a second container disposed within the temperature-regulating container, the one or more valleys directly contacting the inner wall of the housing, wherein the resilient member is configured to move between a relaxed configuration and a plurality of radially compressed configurations, wherein:

the resilient member compresses by a first radial distance when the first container having a first diameter is inserted into the temperature-regulating container;

the resilient member compresses by a second radial distance when the second container having a second diameter greater than the first diameter is inserted into the temperature-regulating container; and the resilient member applies a spring force radially inward when either the first container or the second container is inserted into the temperature-regulating container to secure the first container or second container within the temperature regulating container;

one or more thermoelectric devices configured to transfer heat from the inner wall to the outer wall;

a controller; and one or more temperature sensors coupled to the controller and configured to measure a temperature of the outer wall, wherein the controller receives input from the one or temperature sensors to determine a temperature of outer wall or a rate of change of the temperature of outer wall, and controls the one or more thermoelectric devices based on the determined temperature or determined rate of change of temperature.

18. The temperature-regulating container of claim 17, wherein the controller is configured to shut down the one or more thermoelectric devices if the temperature of the outer wall exceeds a threshold temperature from 100 and 120° F.

* * * * *